United States Patent
Kim et al.

(10) Patent No.: US 11,380,565 B2
(45) Date of Patent: Jul. 5, 2022

(54) SUBSTRATE TRANSFER APPARATUS, SUBSTRATE PROCESSING APPARATUS INCLUDING THE SAME, AND SUBSTRATE MISALIGNMENT COMPENSATION METHOD

(71) Applicant: SEMES CO., LTD., Chungcheongnam-do (KR)

(72) Inventors: Duk Sik Kim, Cheonan-si (KR); Hyun Jun Kim, Busan (KR)

(73) Assignee: SEMES CO., LTD., Chungcheongnam-Do (KR)

(*) Notice: Subject to any disclaimer, the term of this patent is extended or adjusted under 35 U.S.C. 154(b) by 538 days.

(21) Appl. No.: 16/430,631

(22) Filed: Jun. 4, 2019

(65) Prior Publication Data
US 2019/0378735 A1 Dec. 12, 2019

(30) Foreign Application Priority Data
Jun. 8, 2018 (KR) .................. 10-2018-0066129

(51) Int. Cl.
*H01L 21/67* (2006.01)
*H01L 21/677* (2006.01)
(Continued)

(52) U.S. Cl.
CPC ...... *H01L 21/67259* (2013.01); *B25J 9/1692* (2013.01); *B65G 47/905* (2013.01); (Continued)

(58) Field of Classification Search
CPC .. H01L 21/67259; H01L 21/681; H01L 21/68
See application file for complete search history.

(56) References Cited

U.S. PATENT DOCUMENTS 7,933,665 B2 * 4/2011 Sakiya .................. H01L 21/681
                                                       700/57
9,805,960 B2 * 10/2017 Shindo .............. H01L 21/67196
(Continued)

FOREIGN PATENT DOCUMENTS

JP       2006351884 A  * 12/2006
JP          4063921 B2 *  3/2008
(Continued)

OTHER PUBLICATIONS

Y. Chen, Y. Chen and J. Lee, "Experimental results of a wafer positioning system using machine vision after system calibration," 2012 Proceedings of SICE Annual Conference (SICE), 2012, pp. 1014-1017 (Year: 2012).*

(Continued)

*Primary Examiner* — Alia Sabur
(74) *Attorney, Agent, or Firm* — Li & Cai Intellectual Property (USA) Office (57) ABSTRACT

A substrate misalignment compensation method includes obtaining first coordinates for an amount of movement of a substrate transfer apparatus and second coordinates measured by a plurality of sensors installed on the substrate transfer apparatus while moving the substrate transfer apparatus in one direction, calculating a calibration value of the substrate transfer apparatus by using an equation of a circle for the first coordinates and an equation of a line for the second coordinates, and calculating the center of a circle for a substrate based on the calibration value of the substrate transfer apparatus and compensating for misalignment of the substrate by using the center of the circle.

22 Claims, 6 Drawing Sheets

(51) Int. Cl.
- *B65G 47/90* (2006.01)
- *H01L 21/687* (2006.01)
- *H01L 21/68* (2006.01)
- *B25J 9/16* (2006.01)
- *G05B 19/401* (2006.01)
- *G05B 19/402* (2006.01)

(52) U.S. Cl.
CPC ......... *G05B 19/401* (2013.01); *G05B 19/402* (2013.01); *H01L 21/67742* (2013.01); *H01L 21/68* (2013.01); *H01L 21/681* (2013.01); *H01L 21/68707* (2013.01); *G05B 2219/39024* (2013.01)

(56) References Cited

U.S. PATENT DOCUMENTS

| | | | | |
|---|---|---|---|---|
| 9,960,063 | B2 * | 5/2018 | Hayashi | ............ H01L 21/67259 |
| 2004/0258514 | A1 * | 12/2004 | Raaijmakers | ......... H01L 21/681 414/416.08 |
| 2012/0046904 | A1 * | 2/2012 | Hayashi | ................ H01L 21/681 702/150 |
| 2015/0214091 | A1 * | 7/2015 | Rodnick | ................ B25J 13/083 700/228 |
| 2016/0189380 | A1 * | 6/2016 | Li | ........................ H04N 13/128 348/50 |

FOREIGN PATENT DOCUMENTS

| | | | |
|---|---|---|---|
| JP | 2011181755 A | * | 9/2011 |
| JP | 2015005684 A | | 1/2015 |
| KR | 10-0397884 B | | 9/2003 |
| KR | 100676823 B1 | | 1/2007 |
| KR | 1020080084310 A | | 9/2008 |
| KR | 20080092013 A | * | 10/2008 |
| KR | 1020120023517 A | | 3/2012 |
| KR | 1020170039436 A | | 4/2017 |
| KR | 10-2017-0048784 A | | 5/2017 |
| KR | 10-1790867 B | | 10/2017 |

OTHER PUBLICATIONS

Korean Patent Office, Office action dated Nov. 18, 2019.
Korean Patent Office, Notice of Allowance dated Feb. 28, 2020.

* cited by examiner

SUBSTRATE TRANSFER APPARATUS, SUBSTRATE PROCESSING APPARATUS INCLUDING THE SAME, AND SUBSTRATE MISALIGNMENT COMPENSATION METHOD

CROSS-REFERENCE TO RELATED APPLICATIONS

A claim for priority under 35 U.S.C. § 119 is made to Korean Patent Application No. 10-2018-0066129 filed on Jun. 8, 2018, in the Korean Intellectual Property Office, the entire contents of which are hereby incorporated by reference.

BACKGROUND

Embodiments of the inventive concept described herein relate to a substrate transfer apparatus for performing calibration of the substrate transfer apparatus while moving the substrate transfer apparatus in one direction, a substrate processing apparatus including the same, and a substrate misalignment compensation method.

A variety of processes, such as photolithography for applying photoresist to a substrate, etching, ion implantation, deposition, cleaning, and the like, are performed to manufacture semiconductor devices or liquid crystal displays. The substrate is transferred from one apparatus to another apparatus in the process in which these processes are performed. In the transfer process, handling of the substrate may be performed by a substrate transfer apparatus such as a transfer robot.

The substrate transfer apparatus transfers the substrate to a plate in each processing unit through an entrance of the processing unit while supporting the substrate. To transfer the substrate to an accurate position, misalignment of the substrate is compensated for before the transfer of the substrate. To compensate for misalignment of the substrate, whether the substrate is out of alignment or not is determined based on a measurement value measured by a sensor of the substrate transfer apparatus. However, in the case where the measurement value measured by the sensor differs from the actual amount of movement of the robot, misalignment of the substrate may not be accurately determined. That is, because the actual sensor is distorted according to an environment of the sensor (e.g., the distance from an object being measured, the material of the object, or the like), there is an error between the measurement value measured by the sensor and the actual amount of movement of the robot. Hence, a calibration operation of mapping the measurement value measured by the sensor and a controlled variable of the robot that has to be compensated for has to be previously performed to compensate for the error.

A calibration method for a robot in the related art includes mapping coordinates measured by a sensor and theoretical coordinates of a robot to generate a graph and substituting the coordinates measured by the sensor into the generated graph to calculate calibrated coordinates of the robot. Therefore, it is absolutely necessary to perform mapping while moving the robot not only vertically but also horizontally. However, the robot calibration method has problems in that it takes much time to perform the calibration and a large error is caused because a user has to perform the mapping operation while moving the robot in the two directions perpendicular to each other.

SUMMARY

Embodiments of the inventive concept provide a substrate transfer apparatus for performing accurate calibration while moving the substrate transfer apparatus in only one direction, a substrate processing apparatus including the same, and a substrate misalignment compensation method.

According to an exemplary embodiment, a substrate misalignment compensation method of a substrate transfer apparatus for transferring a substrate includes obtaining first coordinates for an amount of movement of the substrate transfer apparatus and second coordinates measured by a plurality of sensors installed on the substrate transfer apparatus while moving the substrate transfer apparatus in one direction, calculating a calibration value of the substrate transfer apparatus by using an equation of a circle for the first coordinates and an equation of a line for the second coordinates, and calculating the center of a circle for the substrate based on the calibration value of the substrate transfer apparatus and compensating for misalignment of the substrate by using the center of the circle.

The calculating of the calibration value of the substrate transfer apparatus may include calculating coordinates at which the equation of the circle and the equation of the line meet, calculating a moving distance of the plurality of sensors by using the coordinates at which the equation of the circle and the equation of the line meet, and calculating the calibration value of the substrate transfer apparatus by using the moving distance of the plurality of sensors.

The calculating of the calibration value of the substrate transfer apparatus by using the moving distance of the plurality of sensors may include calculating the calibration value of the substrate transfer apparatus by adding the moving distance of the plurality of sensors and zero set values of the plurality of sensors.

The equation of the circle may be $(x-a)^2+(y-b)^2=r^2$, and the equation of the line may be $x=(x1/y1)y$. Here, "a" and "b" may be central coordinates of the substrate, "r" may be a radius of the substrate, and "x1" and "y1" may be coordinates for a position of the sensor.

The calculating of the coordinates at which the equation of the circle and the equation of the line meet may include substituting the equation of the line into the equation of the circle, resulting in $Ay^2 + By + C = 0$, and calculating the coordinates at which the equation of the circle and the equation of the line meet, by using $$y = \frac{-B \pm \sqrt{B^2 - 4AC}}{2A},$$

$x=(x1/y1)y$.

The compensating of the misalignment of the substrate may include calculating compensated position values of the plurality of sensors based on the moving distance of the plurality of sensors, calculating the center of the circle for the substrate by using at least three of the compensated position values of the plurality of sensors, and comparing the calculated center of the circle and a preset value to compensate for the misalignment of the substrate.

The calculating of the moving distance of the plurality of sensors may include calculating the moving distance of the plurality of sensors by using $\sqrt{(x-x1)^2+(y-y1)^2}$. Here, "x1" and "y1" may be coordinates for positions of the sensors.

The obtaining of the first coordinates and the second coordinates may include repeatedly performing a process of obtaining the first coordinates and the second coordinates after moving the substrate transfer apparatus by a preset distance in the one direction.

The preset distance may be 0.1 mm.

The plurality of sensors may be installed on the substrate transfer apparatus so as to be spaced apart from each other by a predetermined gap along a circumferential direction of the substrate.

According to an exemplary embodiment, a substrate transfer apparatus for transferring a substrate includes a support part that supports the substrate, a driving unit that moves the support part, and a control unit that controls a movement of the driving unit. The control unit includes a sensor module that obtains first coordinates for an amount of movement of the substrate transfer apparatus and second coordinates measured by a plurality of sensors installed on the substrate transfer apparatus while moving the substrate transfer apparatus in one direction, a calculation device that calculates a calibration value of the substrate transfer apparatus by using an equation of a circle for the first coordinates and an equation of a line for the second coordinates, and a compensation device that calculates the center of a circle for the substrate based on the calibration value of the substrate transfer apparatus and compensates for misalignment of the substrate by using the center of the circle.

The calculation device may calculate coordinates at which the equation of the circle and the equation of the line meet, may calculate a moving distance of the plurality of sensors by using the coordinates at which the equation of the circle and the equation of the line meet, and may calculate the calibration value of the substrate transfer apparatus by using the moving distance of the plurality of sensors.

The calculation device may calculate the calibration value of the substrate transfer apparatus by adding the moving distance of the plurality of sensors and zero set values of the plurality of sensors.

The equation of the circle may be $(x-a)^2+(y-b)^2=r^2$, and the equation of the line may be $x=(x1/y1)y$. Here, "a" and "b" may be central coordinates of the substrate, "r" may be a radius of the substrate, and "x1" and "y1" may be coordinates for a position of the sensor.

The calculation device may substitute the equation of the line into the equation of the circle, resulting in $Ay^2 + By + C = 0$, and may calculate the coordinates at which the equation of the circle and the equation of the line meet, by using $$y = \frac{-B \pm \sqrt{B^2 - 4AC}}{2A},$$

$x=(x1/y1)y$.

The compensation device may calculate compensated position values of the plurality of sensors based on the moving distance of the plurality of sensors, may calculate the center of the circle for the substrate by using at least three of the compensated position values of the plurality of sensors, and may compare the calculated center of the circle and a preset value to compensate for the misalignment of the substrate.

The calculation device may calculate the moving distance of the plurality of sensors by using $\sqrt{(x-x1)^2+(y-y1)^2}$. Here, "x1" and "y1" may be coordinates for positions of the sensors.

The control unit may repeatedly perform a process of obtaining the first coordinates and the second coordinates after moving the substrate transfer apparatus by a preset distance in the one direction.

The preset distance may be 0.1 mm.

The plurality of sensors may be installed on the substrate transfer apparatus so as to be spaced apart from each other by a predetermined gap along a circumferential direction of the substrate.

According to an exemplary embodiment, an apparatus for processing a substrate includes a processing module including a process chamber in which a process is performed on the substrate, a load port on which a carrier having the substrate received therein is placed, and a substrate transfer apparatus that transfers the substrate. The substrate transfer apparatus includes a support part that supports the substrate, a driving unit that moves the support part, and a control unit that controls a movement of the driving unit. The control unit includes a sensor module that obtains first coordinates for an amount of movement of the substrate transfer apparatus and second coordinates measured by a plurality of sensors installed on the substrate transfer apparatus while moving the substrate transfer apparatus in one direction, a calculation device that calculates a calibration value of the substrate transfer apparatus by using an equation of a circle for the first coordinates and an equation of a line for the second coordinates, and a compensation device that calculates the center of a circle for the substrate based on the calibration value of the substrate transfer apparatus and compensates for misalignment of the substrate by using the center of the circle.

According to an exemplary embodiment, a substrate misalignment compensation method is implemented as a program for executing the substrate misalignment compensation method by a computer and is recorded in a computer readable recording medium.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

Figure 1:
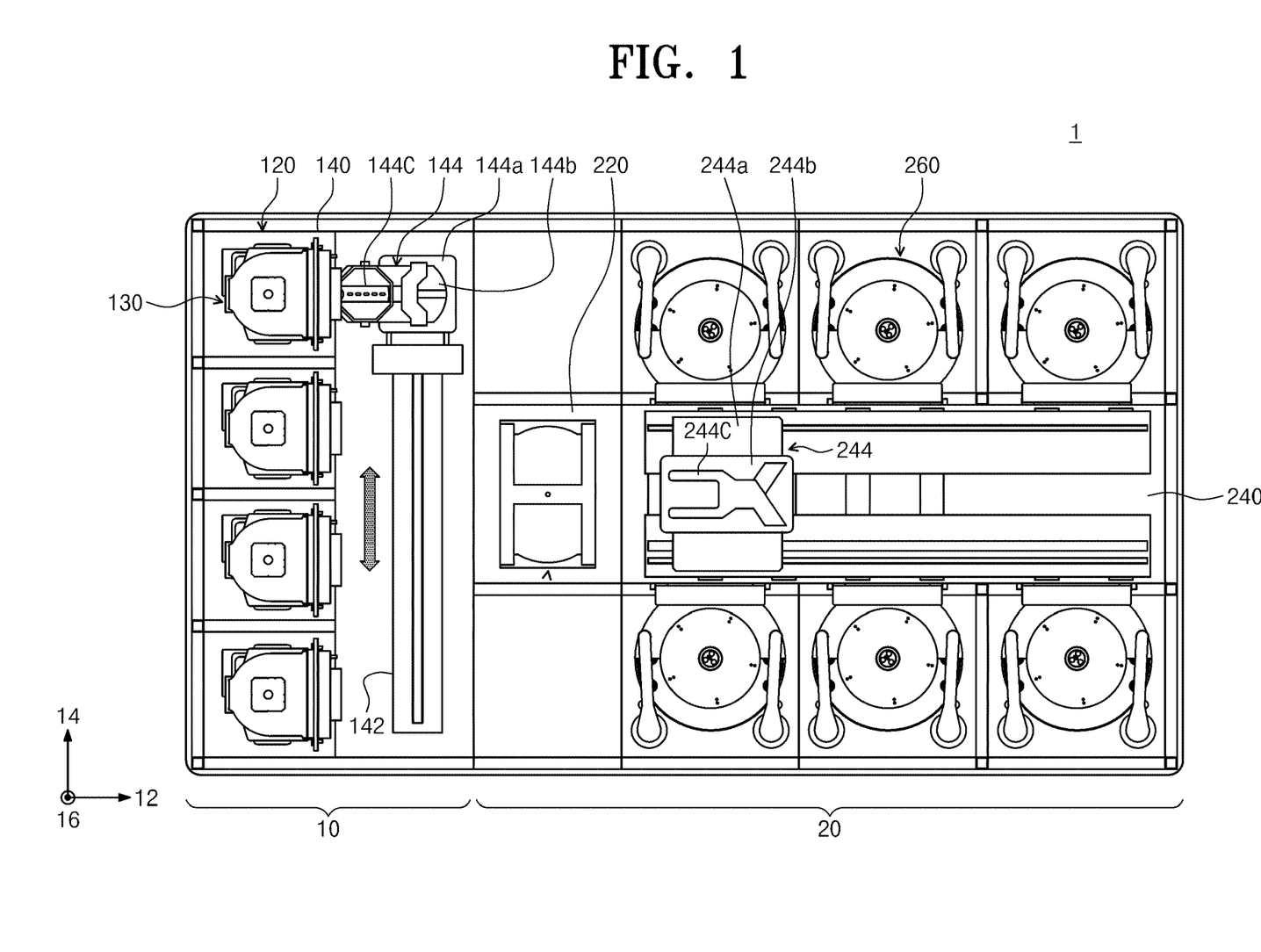
FIG. 1 is a plan view illustrating a substrate processing apparatus according to an embodiment of the inventive concept.

FIG. 1 is a schematic plan view illustrating a substrate processing apparatus 1 of the inventive concept.

Referring to FIG. 1, the substrate processing apparatus 1 has an index module 10 and a processing module 20, and the index module 10 has load ports 120 and a transfer frame 140. The load ports 120, the transfer frame 140, and the processing module 20 are sequentially arranged in a row. Hereinafter, the direction in which the load ports 120, the transfer frame 140, and the processing module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

Carriers 130, each of which has substrates W received therein, are placed on the load ports 120. The load ports 120 are arranged in a row along the second direction 14. The number of load ports 120 may be increased or decreased depending on conditions such as process efficiency and footprint of the processing module 20. Each of the carriers 130 includes a plurality of slots (not illustrated) for receiving the substrates W in a horizontal position relative to the ground. A front opening unified pod (FOUP) may be used as the carrier 130.

The processing module 20 includes a buffer unit 220, a transfer chamber 240, and process chambers 260. The transfer chamber 240 is arranged such that the longitudinal direction thereof is parallel to the first direction 12. The process chambers 260 are arranged on opposite sides of the transfer chamber 240. The process chambers 260 on the opposite sides of the transfer chamber 240 are symmetric to each other with respect to the transfer chamber 240. A plurality of process chambers 260 are provided on the one side of the transfer chamber 240. Some of the process chambers 260 are arranged along the longitudinal direction of the transfer chamber 240. Furthermore, other process chambers 260 are stacked one above another. That is, the process chambers 260 may be arranged in an A×B array on the one side of the transfer chamber 240. Here, A denotes the number of process chambers 260 arranged in a row along the first direction 12, and B denotes the number of process chambers 260 arranged in a column along the third direction 16. In the case where four or six process chambers 260 are provided on the one side of the transfer chamber 240, the process chambers 260 may be arranged in a 2×2 or 3×2 array. The number of process chambers 260 may be increased or decreased. Alternatively, the process chambers 260 may be provided on only the one side of the transfer chamber 240. In another case, the process chambers 260 may be arranged in a single layer on the opposite sides of the transfer chamber 240.

The buffer unit 220 is disposed between the transfer frame 140 and the transfer chamber 240. The buffer unit 220 provides a space in which substrates W stay before transferred between the transfer chamber 240 and the transfer frame 140. The buffer unit 220 has slots (not illustrated) therein, on which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers substrates W between the carriers 130 placed on the load ports 120 and the buffer unit 220. An index rail 142 and an index robot 144 are provided in the transfer frame 140. The index rail 142 is arranged such that the longitudinal direction thereof is parallel to the second direction 14. The index robot 144 is mounted on the index rail 142 and linearly moves along the index rail 142 in the second direction 14. The index robot 144 has a base 144a, a body 144b, and index arms 144c. The base 144a is movable along the index rail 142. The body 144b is coupled to the base 144a. The body 144b is movable on the base 144a along the third direction 16. Furthermore, the body 144b is rotatable on the base 144a. The index arms 144c are coupled to the body 144b and are movable forward and backward relative to the body 144b. The plurality of index arms 144c may operate individually. The index arms 144c are stacked one above another with a spacing gap therebetween along the third direction 16. Some of the index arms 144c may be used to transfer substrates W from the processing module 20 to the carriers 130, and the other index arms 144c may be used to transfer substrates W from the carriers 130 to the processing module 20. Accordingly, particles generated from substrates W to be processed may be prevented from adhering to processed substrates W in the process in which the index robot 144 transfers the substrates W between the carriers 130 and the processing module 20.

The transfer chamber 240 transfers substrates W between the buffer unit 220 and the process chambers 260 and between the process chambers 260. A guide rail 242 and a main robot 244 are provided in the transfer chamber 240. The guide rail 242 is arranged such that the longitudinal direction thereof is parallel to the first direction 12. The main robot 244 is installed on the guide rail 242 and linearly moves on the guide rail 242 along the first direction 12. The main robot 244 has a base 244a, a body 244b, and main arms 244c. The base 244a is movable along the guide rail 242. The body 244b is coupled to the base 244a. The body 244b is movable on the base 244a along the third direction 16. Furthermore, the body 244b is rotatable on the base 244a. The main arms 244c are coupled to the body 244b and are movable forward and backward relative to the body 244b. The plurality of main arms 244c may operate individually. The main arms 244c are stacked one above another with a spacing gap therebetween along the third direction 16.

The process chambers 260 have a space in which a process is performed on a substrate W placed on a substrate support unit that supports the substrate. The process chambers 260 may have a configuration for performing a cleaning process on the substrate W. The configurations in the process chambers 260 may have different structures depending on the types of cleaning processes performed. In contrast, the configurations in the process chambers 260 may have the same structure. Selectively, the process chambers 260 may be divided into a plurality of groups. Configurations in the process chambers 260 belonging to the same group may be the same as each other, and configurations in the process chambers 260 belonging to different groups may differ from each other. For example, in the case where the process chambers 260 are divided into two groups, a first group of process chambers 260 may be disposed on the one side of the transfer chamber 240, and a second group of process chambers 260 may be disposed on the opposite side of the transfer chamber 240. On the opposite sides of the transfer chamber 240, the first group of process chambers 260 may be disposed in a lower layer, and the second group of process chambers 260 may be disposed in an upper layer. The first group of process chambers 260 may be distinguished from the second group of process chambers 260 according to the types of chemicals used and the types of cleaning methods. In contrast, the first group of process chambers 260 and the second group of process chambers 260 may sequentially perform processes on one substrate W. For example, the substrate W may be subjected to a chemical processing process or a rinsing process in the first group of process chambers 260 and may be subjected to a rinsing process or a drying process in the second group of process chambers 260.

Although it has been exemplified that the substrate processing apparatus includes the plurality of process chambers 260 in which a cleaning process is performed, one process chamber 260 may be provided. Furthermore, one of configurations for performing various processes, such as photolithography, etching, ion implantation, and deposition, on substrates may be provided in each of the process chambers 260.

Hereinafter, a substrate transfer apparatus 100 of the inventive concept will be described. The substrate transfer apparatus 100 transfers a substrate to a plurality of target positions. According to an embodiment, the substrate transfer apparatus 100 may be provided as the index robot 144 or the main robot 244 of FIG. 1. Accordingly, as described above, the substrate transfer apparatus 100 transfers substrates between the carriers 130 placed on the load ports 120 and the process chambers 260, or between the process chambers 260, while moving along the rail provided. Furthermore, a support part 1000, which will be described below, may be provided at one end of each index arm 144c or at one end of each main arm 244c.

Figure 2:
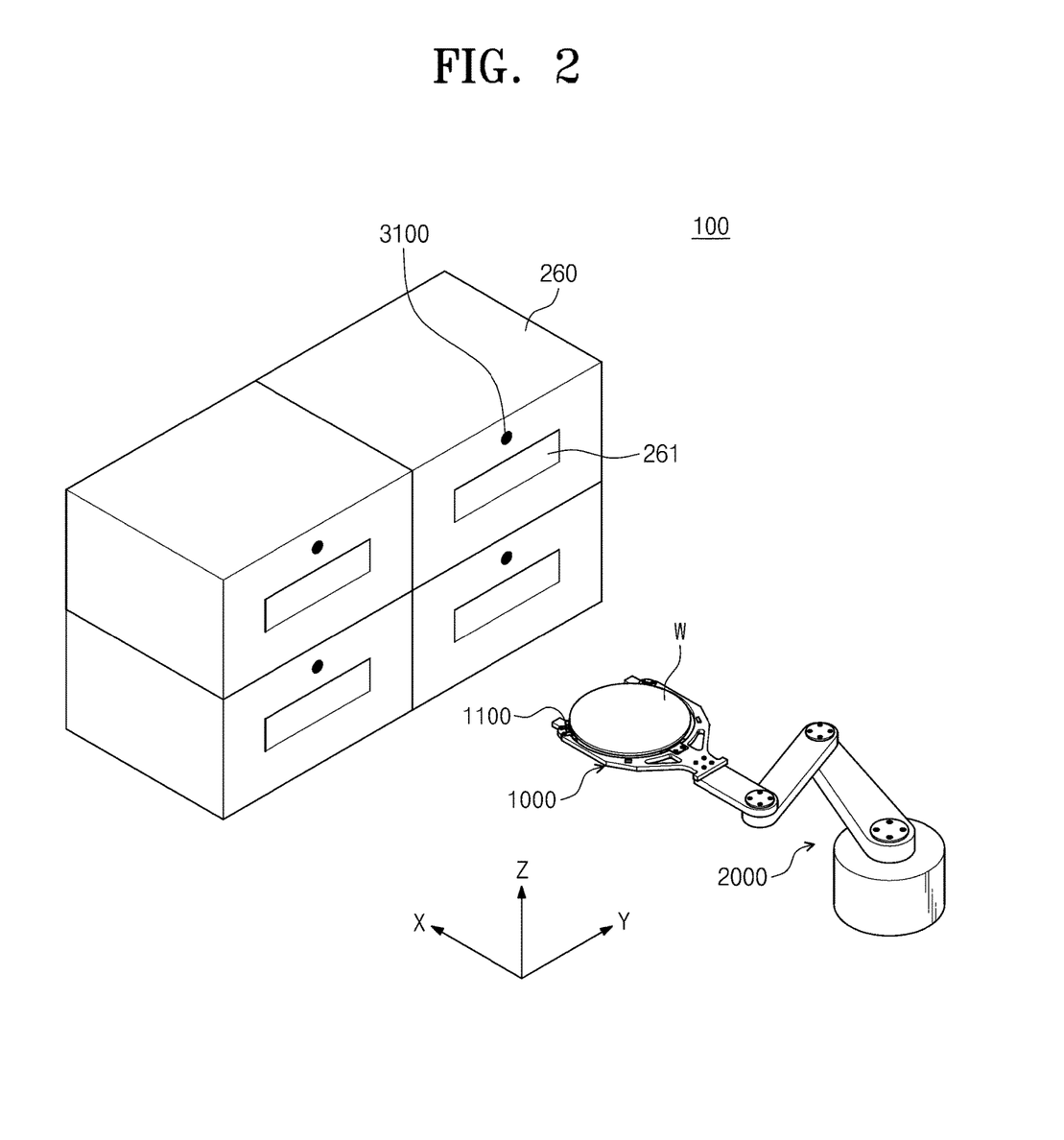
FIG. 2 is a perspective view illustrating a substrate transfer apparatus according to an embodiment of the inventive concept.

FIG. 2 is a perspective view illustrating the substrate transfer apparatus 100 of the inventive concept. Referring to FIG. 2, the substrate transfer apparatus 100 includes the support part 1000, a driving unit 2000, and a control unit 3000.

The support part 1000 supports a substrate and moves to a plurality of target positions. For example, for transfer of a substrate, the support part 1000 supports the substrate, passes through a substrate inlet 261 of the process chamber 260 or a substrate inlet of the carrier 130, and places the substrate on the substrate support unit 262 in the process chamber 260 or a substrate support in the carrier 130, or raises a substrate from the substrate support unit 262 or the substrate support in the carrier 130.

The driving unit 2000 moves the support part 1000. The driving unit 2000 may include a support arm to which the support part 1000 is fixed at one end and that has a plurality of joints, and a driving motor that drives the joints of the support arm. The driving unit 2000 moves the support part 1000 in the vertical and horizontal directions.

The control unit 3000 may include a sensor module 3010 that obtains first coordinates for the amount of movement of the support part 1000 and second coordinates measured by a plurality of sensors installed on the support part 1000 while moving the support part 1000 in one direction, a calculation device 3020 that calculates a calibration value of the substrate transfer apparatus 100 by using an equation of a circle for the first coordinates and an equation of a line for the second coordinates, and a compensation device 3030 that calculates the center of a circle for a substrate based on the calibration value of the substrate transfer apparatus 100 and compensates for misalignment of the substrate by using the center of the circle.

Figure 3:
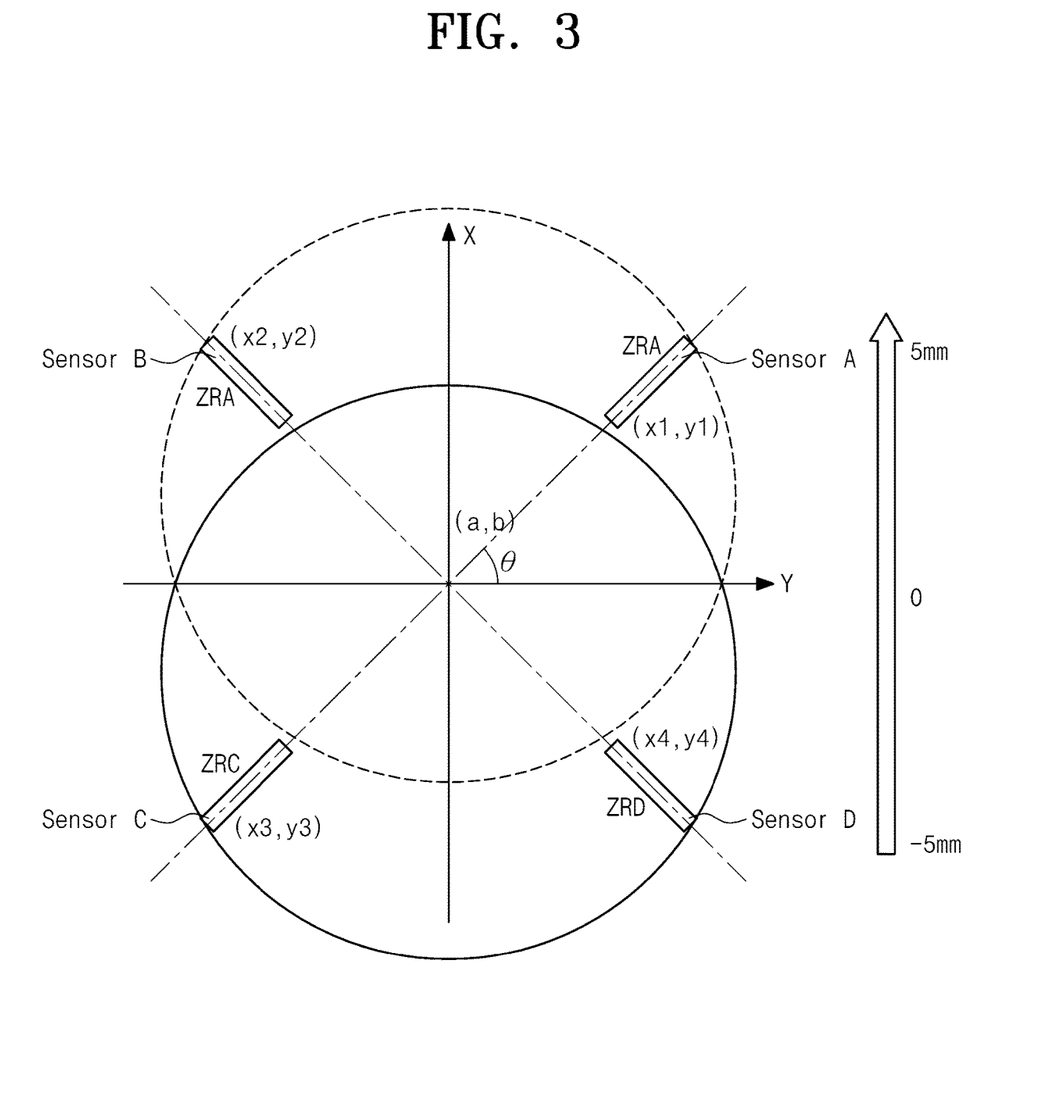
FIGS. 3 and 4 are views illustrating a calibration method for the substrate transfer apparatus according to an embodiment of the inventive concept.

Hereinafter, a method in which the control unit 3000 compensates for positions values of a plurality of sensors and compensates for misalignment of a substrate by using the compensated position values of the plurality of sensors will be described with reference to FIGS. 3 and 4. The sensor module 3010 may be provided as a plurality of sensors installed on the support part 1000 of the substrate transfer apparatus 100 or may be provided as sensors installed on the support part 1000 and on a side of the process chamber 260. The plurality of sensors may be installed on the support part 1000 of the substrate transfer apparatus 100 so as to be spaced apart from each other by a predetermined gap along the circumferential direction of a substrate. As illustrated in FIG. 3, when the support part 1000 of the substrate transfer apparatus 100 moves in one direction, the sensor module 3010 may obtain first coordinates for the amount of movement of the substrate transfer apparatus 100 and second coordinates measured by the plurality of sensors.

Figure 4:
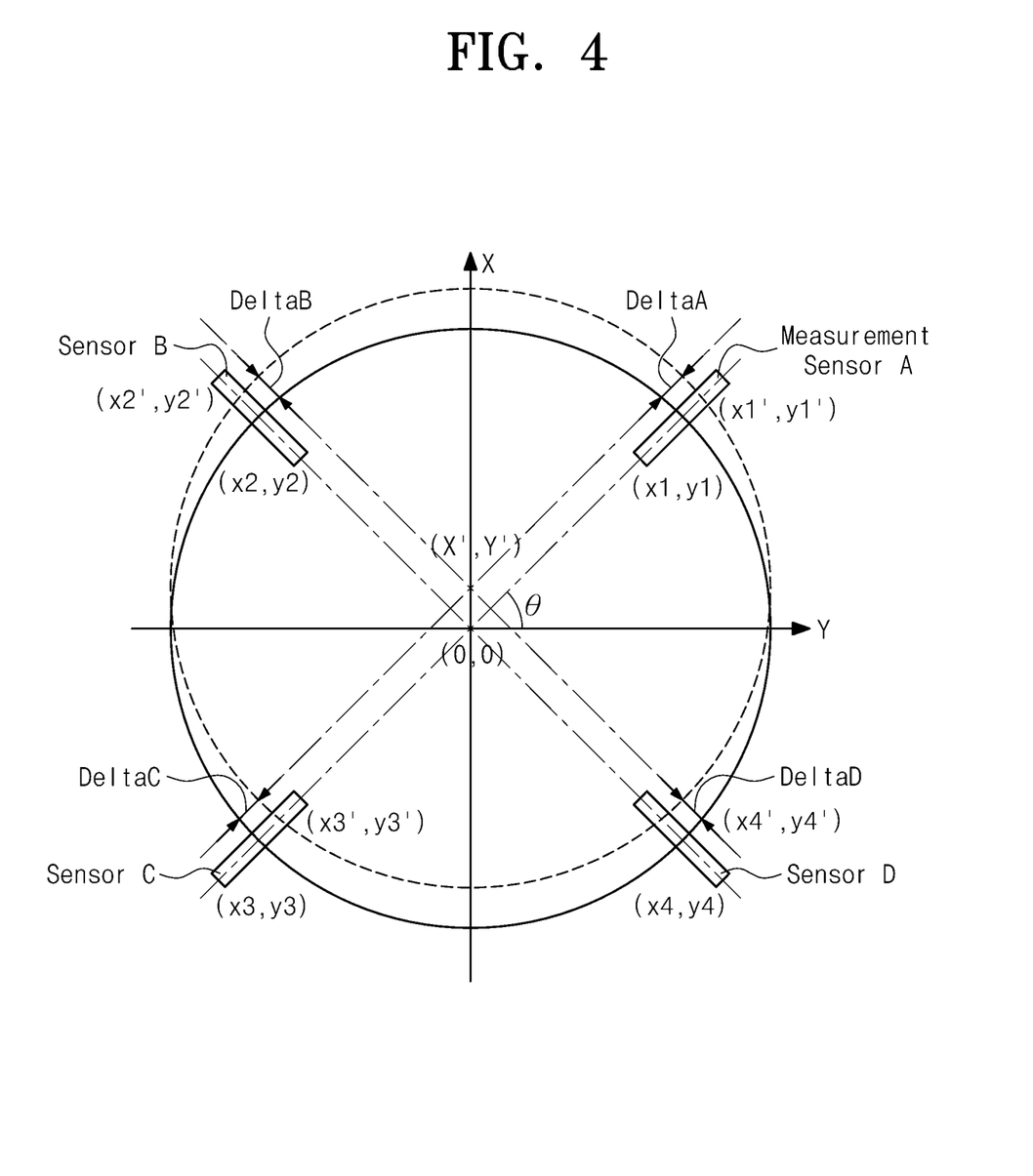

Referring to FIG. 4, the calculation device 3020 calculates the moving distance of the plurality of sensors by using coordinates at which an equation of a circle using the first coordinates for the amount of movement of the substrate transfer apparatus 100 and an equation of a line using the second coordinates measured by the plurality of sensors meet, and thereafter calculates a calibration value of the substrate transfer apparatus 100 by using the moving distance of the plurality of sensors. Specifically, the calculation device 3020 may obtain the following Equation 1 using the first coordinates for the amount of movement of the substrate transfer apparatus 100 and the following Equation 2 using the second coordinates measured by the plurality of sensors, may substitute Equation 2 into Equation 1, resulting in $Ay^2 + By + C = 0$ and may calculate x and y values. In this case, the x value and the y value may be $$y = \frac{-B \pm \sqrt{B^2 - 4AC}}{2A}, x = (x1/y1)y.$$

[Equation 1]

$$(x-a)^2 + (y-b)^2 = r^2 \qquad \text{[Equation 1]}$$

Here, "a" and "b" are the central coordinates of the substrate, and "r" is the radius of the substrate.

$$x = (x1/y1)y \qquad \text{[Equation 2]}$$

Here, "x1" and "y1" are coordinates for the position of a sensor.

When the x and y values at which the equation of the circle using the first coordinates for the amount of movement of the substrate transfer apparatus 100 and the equation of the line using the second coordinates measured by the plurality of sensors meet are calculated, the calculation device 3020 may calculate the moving distance of the plurality of sensors by using Equation 3 below when the substrate transfer apparatus 100 moves a preset distance. The calculation device 3020 may calculate compensated position values of the plurality of sensors, based on the moving distance of the plurality of sensors.

$$\sqrt{(x-x1)^2 + (y-y1)^2} \qquad \text{[Equation 3]}$$

Here, "x1" and "y1" are coordinates for the position of a sensor.

Thereafter, the compensation device 3030 may calculate compensated position values of the plurality of sensors based on the moving distance of the plurality of sensors, may calculate the center of a circle for the substrate by using at least three of the compensated position values of the plurality of sensors, and may compare the calculated center of the circle and a preset value to compensate for misalignment of the substrate. Here, the compensation device 3030 may calculate a calibration value of the substrate transfer apparatus 100 by adding the moving distance of the plurality of sensors and zero set values of the plurality of sensors.

The control unit 3000 may obtain the first coordinates and the second coordinates by using the sensor module 3010 every predetermined period (e.g., 0.1 mm) while moving the substrate transfer apparatus 100 by a preset distance in one direction, and the calculation device 3020 and the compensation device 3030 may calculate the compensated position values of the plurality of sensors by using the obtained first and second coordinates and may compensate for misalignment of the substrate by using at least three of the compensated position values of the plurality of sensors.

Figure 5:
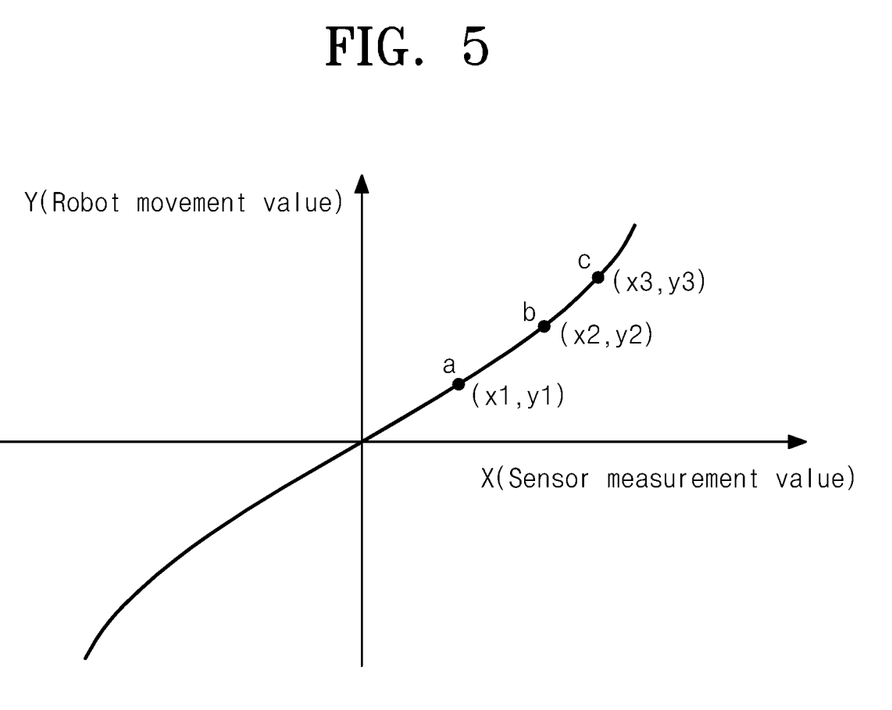
FIG. 5 is a view illustrating a method of mapping a measurement value of a sensor and an amount of movement of a robot according to an embodiment of the inventive concept.

When the compensated position values of the plurality of sensors are calculated by the compensation device 3030, the control unit 3000 may map the compensated position values of the plurality of sensors that correspond to the amount of movement of the substrate transfer apparatus 100. A graph obtained by mapping the compensated position values of the plurality of sensors for the amount of movement of the substrate transfer apparatus 100 while moving the substrate transfer apparatus 100 may be represented as in FIG. 5. The control unit 3000 determines misalignment of the substrate by using the compensated position values of the plurality of sensors corresponding to the amount of movement of the substrate transfer apparatus 100 by using the mapping graph and compensates for the misalignment of the substrate, thereby more accurately compensating for the misalignment of the substrate and thus improving process efficiency.

Figure 6:
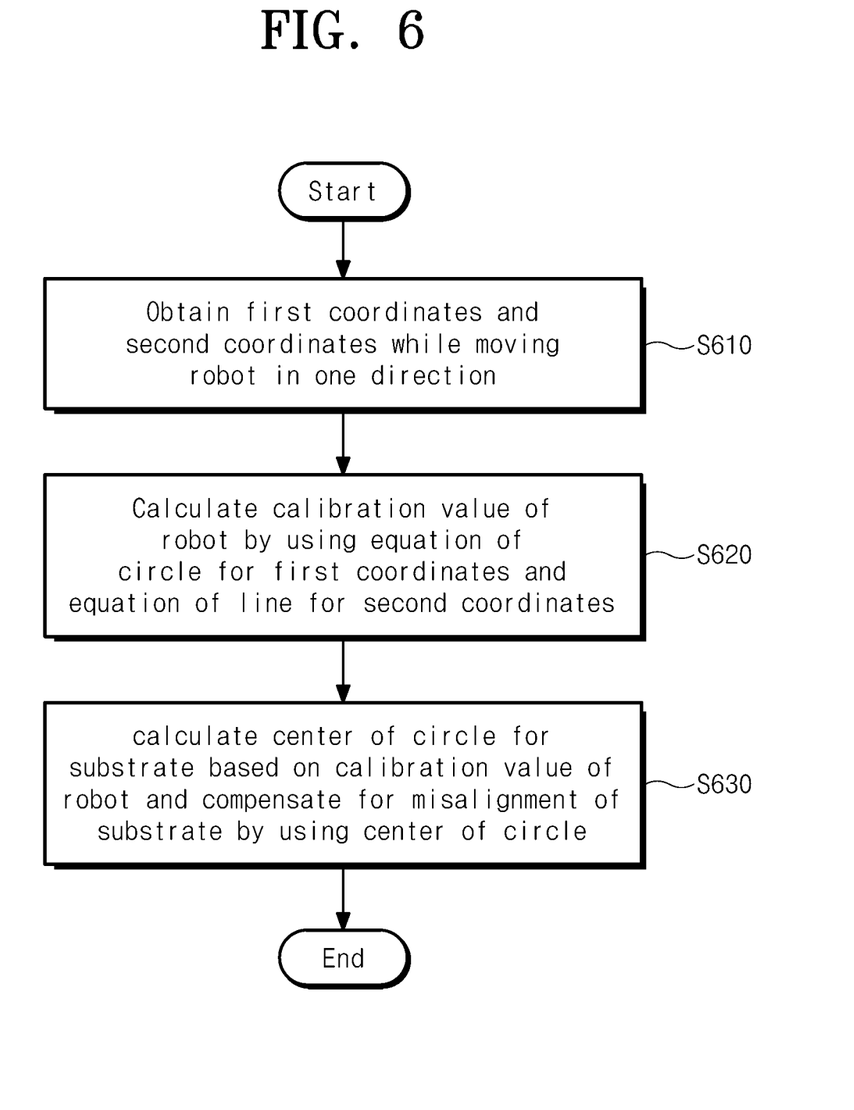
FIG. 6 is a flowchart illustrating a method of compensating for misalignment of a substrate according to an embodiment of the inventive concept.

FIG. 6 is a flowchart illustrating a method of compensating for misalignment of a substrate according to an embodiment of the inventive concept.

First, the control unit 3000 obtains first coordinates for the amount of movement of the substrate transfer apparatus 100 and second coordinates measured by the plurality of sensors installed on the substrate transfer apparatus 100 while moving the substrate transfer apparatus 100 in one direction (S610). For example, after moving the substrate transfer apparatus 100 by a preset distance in one direction, the control unit 3000 may repeatedly perform the process of obtaining the first coordinates for the amount of movement of the substrate transfer apparatus 100 and the second coordinates measured by the plurality of sensors installed on the substrate transfer apparatus 100.

Next, the control unit 3000 calculates a calibration value of the substrate transfer apparatus 100 by using an equation of a circle for the first coordinates and an equation of a line for the second coordinates (S620). Specifically, the control unit 3000 calculates coordinates at which the equation of the circle for the first coordinates and the equation of the line for the second coordinates meet, calculates the moving distance of the plurality of sensors by using the coordinates at which the equation of the circle for the first coordinates and the equation of the line for the second coordinates meet, and calculates the calibration value of the substrate transfer apparatus 100 by using the moving distance of the plurality of sensors. In this case, the Equation of the circle for the first coordinates may be $(x-a)^2+(y-b)^2=r^2$, and the equation of the line for the second coordinates may be $x=(x1/y1)y$. Here, "a" and "b" are the central coordinates of the substrate, "r" is the radius of the substrate, and "x1" and "y1" are coordinates for the position of a sensor. Furthermore, the coordinates at which the equation of the circle for the first coordinates and the equation of the line for the second coordinates meet may be calculated by substituting the equation of the line for the second coordinates into the equation of the circle for the first coordinates, resulting in $Ay^2+By+C=0$, and using equations $$y = \frac{-B \pm \sqrt{B^2 - 4AC}}{2A},$$

$x=(x1/y1)y$. In addition, when the coordinates at which the equation of the circle for the first coordinates and the equation of the line for the second coordinates meet are calculated, the control unit 300 may calculate the moving distance of the plurality of sensors by using Equation 3: $\sqrt{(x-x1)^2+(y-y1)^2}$. Here, "x1" and "y1" are coordinates for the position of a sensor.

Then, the control unit 3000 calculates the center of a circle for the substrate based on the calibration value of the substrate transfer apparatus 100 and compensates for misalignment of the substrate by using the center of the circle (S630). Specifically, the compensation device 3030 may calculate compensated position values of the plurality of sensors based on the moving distance of the plurality of sensors, may calculate the center of a circle for the substrate by using at least three of the compensated position values of the plurality of sensors, and may compare the calculated center of the circle and a preset value to compensate for misalignment of the substrate.

As described above, according to the various embodiments of the inventive concept, the calibration of the substrate transfer apparatus 100 may be performed while the substrate transfer apparatus 100 is being moved in only one direction, and misalignment of a substrate may be more accurately compensated for.

A method of compensating for misalignment of a substrate according to an embodiment of the inventive concept may be made as a program for execution on a computer and may be stored in a computer readable recording medium. The computer readable recording medium may include all types of storage devices for storing data that can be read by a computer system. Examples of the computer readable recording medium may include a ROM, a RAM, a CD-ROM, a magnetic tape, a floppy disk, and an optical data storage device. In addition, the substrate misalignment compensation method may be implemented as a computer program stored on a medium for execution in association with the computer.

As described above, according to the various embodiments of the inventive concept, calibration of the substrate transfer apparatus may be performed while the substrate transfer apparatus is being moved in only one direction, and misalignment of a substrate may be more accurately compensated for.

While the inventive concept has been described with reference to embodiments, the embodiments are only for description of the spirit and scope of the inventive concept and the inventive concept is not limited thereto. It will be understood by those skilled in the art that various modifications can be made to the above-described embodiments. The spirit and scope of the inventive concept should be construed on the basis of the accompanying claims.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate misalignment compensation method of a substrate transfer apparatus for transferring a substrate comprising:
    obtaining first coordinates of the substrate transfer apparatus and second coordinates measured by a plurality of sensors installed on the substrate transfer apparatus while moving the substrate transfer apparatus in one direction;
    calculating a calibration value of the substrate transfer apparatus by using an equation of a circle centered at the first coordinates and an equation of a line passing through the second coordinates; and
    calculating the center of a circle to determine a center of the substrate based on the calibration value of the substrate transfer apparatus and compensating for misalignment of the substrate by using the center of the circle.

2. The substrate misalignment compensation method of claim 1, wherein the calculating of the calibration value of the substrate transfer apparatus includes:
    calculating coordinates at which the equation of the circle and the equation of the line meet;
    calculating a moving distance of the plurality of sensors by using the coordinates at which the equation of the circle and the equation of the line meet; and
    calculating the calibration value of the substrate transfer apparatus by using the moving distance of the plurality of sensors.

3. The substrate misalignment compensation method of claim 2, wherein the calculating of the calibration value of the substrate transfer apparatus by using the moving distance of the plurality of sensors includes:
    calculating the calibration value of the substrate transfer apparatus by adding the moving distance of the plurality of sensors and zero set values of the plurality of sensors.

4. The substrate misalignment compensation method of claim 2, wherein the equation of the circle is $(x-a)^2+(y-b)^2=r^2$,
    wherein the equation of the line is $x=(x1/y1)y$, and
    wherein "a" and "b" are central coordinates of the substrate after the substrate transfer apparatus is moved in the one direction, "r" is a radius of the substrate, and "x1" and "y1" are the second coordinates for a position of the sensor.

5. The substrate misalignment compensation method of claim 4, wherein the calculating of the coordinates at which the equation of the circle and the equation of the line meet includes:
    substituting the equation of the line into the equation of the circle, resulting in $Ay^2+By+C=0$, and calculating the coordinates at which the equation of the circle and the equation of the line meet, by using $$y=\frac{-B\pm\sqrt{B^2-4AC}}{2A},$$

$x=(x1/y1)y$.

6. The substrate misalignment compensation method of claim 2, wherein the compensating of the misalignment of the substrate includes:
    calculating compensated position values of the plurality of sensors based on the moving distance of the plurality of sensors;
    calculating the center of the circle to determine the center of the substrate by using at least three of the compensated position values of the plurality of sensors; and
    comparing the calculated center of the circle and a preset value to compensate for the misalignment of the substrate.

7. The substrate misalignment compensation method of claim 2, wherein the calculating of the moving distance of the plurality of sensors includes:
    calculating the moving distance of the plurality of sensors by using $\sqrt{(x-x1)^2+(y-y1)^2}$, wherein "x" and "y" are calculated coordinates at which the equation of the circle and the equation of the line meet, and "x1" and "y1" are the second coordinates for a position of the sensor.

8. The substrate misalignment compensation method of claim 1, wherein the obtaining of the first coordinates and the second coordinates includes:
    repeatedly performing a process of obtaining the first coordinates and the second coordinates after moving the substrate transfer apparatus by a preset distance in the one direction.

9. The substrate misalignment compensation method of claim 8, wherein the preset distance is 0.1 mm.

10. The substrate misalignment compensation method of claim 1, wherein the plurality of sensors are installed on the substrate transfer apparatus so as to be spaced apart from each other by a predetermined gap along a circumferential direction of the substrate.

11. A substrate transfer apparatus for transferring a substrate, comprising:
    a support part configured to support the substrate;
    a driving unit configured to move the support part; and
    a control unit configured to control a movement of the driving unit,
    wherein the control unit includes:
    a sensor module configured to obtain first coordinates of the substrate transfer apparatus and second coordinates measured by a plurality of sensors installed on the substrate transfer apparatus while moving the substrate transfer apparatus in one direction;
    a calculation device configured to calculate a calibration value of the substrate transfer apparatus by using an equation of a circle centered at the first coordinates and an equation passing through a line for the second coordinates; and
    a compensation device configured to calculate the center of a circle to determine a center of the substrate based on the calibration value of the substrate transfer apparatus and compensate for misalignment of the substrate by using the center of the circle.

12. The substrate transfer apparatus of claim 11, wherein the calculation device calculates coordinates at which the equation of the circle and the equation of the line meet, calculates a moving distance of the plurality of sensors by using the coordinates at which the equation of the circle and the equation of the line meet, and calculates the calibration value of the substrate transfer apparatus by using the moving distance of the plurality of sensors.

13. The substrate transfer apparatus of claim 12, wherein the calculation device calculates the calibration value of the substrate transfer apparatus by adding the moving distance of the plurality of sensors and zero set values of the plurality of sensors.

14. The substrate transfer apparatus of claim 12, wherein the equation of the circle is $(x-a)^2+(y-b)^2=r^2$, wherein the equation of the line is x=(x1/y1)y, and wherein "a" and "b" are central coordinates of the substrate after the substrate transfer apparatus is moved in the one direction, "r" is a radius of the substrate, and "x1" and "y1" are coordinates for a position of the sensor.

15. The substrate transfer apparatus of claim 14, wherein the calculation device substitutes the equation of the line into the equation of the circle, resulting in $Ay^2+ By+C=0$, and calculates the coordinates at which the equation of the circle and the equation of the line meet, by using $$y = \frac{-B \pm \sqrt{B^2 - 4AC}}{2A},$$

x=(x1/y1)y.

16. The substrate transfer apparatus of claim 12, wherein the compensation device calculates compensated position values of the plurality of sensors based on the moving distance of the plurality of sensors, calculates the center of the circle for the substrate by using at least three of the compensated position values of the plurality of sensors, and compares the calculated center of the circle and a preset value to compensate for the misalignment of the substrate.

17. The substrate transfer apparatus of claim 12, wherein the calculation device calculates the moving distance of the plurality of sensors by using $\sqrt{(x-x1)^2+(y-y1)^2}$, wherein "x" and "y" are calculated coordinates at which the equation of the circle and the equation of the line meet, and "x1" and "y1" are coordinates for a position of the sensor.

18. The substrate transfer apparatus of claim 11, wherein the control unit repeatedly performs a process of obtaining the first coordinates and the second coordinates after moving the substrate transfer apparatus by a preset distance in the one direction.

19. The substrate transfer apparatus of claim 18, wherein the preset distance is 0.1 mm.

20. The substrate transfer apparatus of claim 11, wherein the plurality of sensors are installed on the substrate transfer apparatus so as to be spaced apart from each other by a predetermined gap along a circumferential direction of the substrate.

21. An apparatus for processing a substrate, the apparatus comprising:
- a processing module including a process chamber in which a process is performed on the substrate;
- a load port on which a carrier having the substrate received therein is placed; and
- a substrate transfer apparatus configured to transfer the substrate, wherein the substrate transfer apparatus includes:
- a support part configured to support the substrate;
- a driving unit configured to move the support part; and
- a control unit configured to control a movement of the driving unit, and wherein the control unit includes:
- a sensor module configured to obtain first coordinates of the substrate transfer apparatus and second coordinates measured by a plurality of sensors installed on the substrate transfer apparatus while moving the substrate transfer apparatus in one direction;
- a calculation device configured to calculate a calibration value of the substrate transfer apparatus by using an equation of a circle centered at the first coordinates and an equation of a line passing through the second coordinates; and
- a compensation device configured to calculate the center of a circle to determine a center of the substrate based on the calibration value of the substrate transfer apparatus and compensate for misalignment of the substrate by using the center of the circle.

22. A computer readable recording medium having a program recorded therein for executing the substrate misalignment compensation method according to claim 1 by a computer.

* * * * *